United States Patent
Chen et al.

(10) Patent No.: US 11,852,679 B2
(45) Date of Patent: Dec. 26, 2023

(54) CIRCUIT BOARD FOR SEMICONDUCTOR TEST

(71) Applicant: MPI CORPORATION, Chu-Pei (TW)

(72) Inventors: Shih-Ching Chen, Chu-pei (TW); Jun-Liang Lai, Chu-pei (TW); Shung-Bo Lin, Chu-pei (TW); Ta-Cheng Liao, Chu-pei (TW); Yu-Chih Hsiao, Chu-pei (TW); Kun-Han Hsieh, Chu-pei (TW)

(73) Assignee: MPI CORPORATION, Chu-Pei (TW)

( * ) Notice: Subject to any disclaimer, the term of this patent is extended or adjusted under 35 U.S.C. 154(b) by 0 days.

(21) Appl. No.: 17/720,510

(22) Filed: Apr. 14, 2022

(65) Prior Publication Data

US 2022/0334178 A1   Oct. 20, 2022

Related U.S. Application Data

(60) Provisional application No. 63/230,092, filed on Aug. 6, 2021, provisional application No. 63/175,563, filed on Apr. 16, 2021.

(51) Int. Cl.
| | |
|---|---|
| G01R 31/26 | (2020.01) |
| G01R 31/28 | (2006.01) |
| G01R 1/02 | (2006.01) |
| G01R 1/04 | (2006.01) |
| G01R 1/067 | (2006.01) |
| G01R 1/073 | (2006.01) |

(52) U.S. Cl.
CPC ...... *G01R 31/2889* (2013.01); *G01R 1/07328* (2013.01); *G01R 1/07342* (2013.01); *G01R 31/2601* (2013.01)

(58) Field of Classification Search
CPC .......... G01R 31/26; G01R 31/28; G01R 1/02; G01R 1/04; G01R 1/067; G01R 1/073; G01R 1/20
See application file for complete search history.

(56) References Cited

U.S. PATENT DOCUMENTS

2022/0065897 A1* 3/2022 Tseng ............... H05K 1/183

* cited by examiner

*Primary Examiner* — Neel D Shah
(74) *Attorney, Agent, or Firm* — Birch, Stewart, Kolasch & Birch, LLP

(57) ABSTRACT

A circuit board for semiconductor test includes first and second sub-circuit boards, and an insulating dielectric layer therebetween. Each sub-circuit board includes a substrate and circuits including upper and lower contacts. The insulating dielectric layer includes through holes, and connecting conductors disposed therein and electrically connected with the upper and lower contacts of two sub-circuit boards. The circuit board is defined with central and peripheral regions. The lower contacts of the first sub-circuit board in the central region are electrically connected with a probe head. The upper contacts of the second sub-circuit board in the peripheral region are electrically connected with a tester, larger in pitch than the lower contacts of the first sub-circuit board in the central region, and larger in amount than the lower contacts of the first sub-circuit board in the peripheral region. The circuit board has great power test uniformity.

13 Claims, 5 Drawing Sheets

CIRCUIT BOARD FOR SEMICONDUCTOR TEST

CROSS REFERENCE TO RELATED APPLICATIONS

This non-provisional application claims the benefit under 35 U.S.C. § 119(e) to U.S. Provisional Application No. 63/175,563, filed on Apr. 16, 2021 and U.S. Provisional Application No. 63/230,092, filed on Aug. 6, 2021, all of which are hereby expressly incorporated by reference into the present application.

BACKGROUND OF THE INVENTION

1. Field of the Invention

The present invention relates to circuit boards and more particularly, to a circuit board for semiconductor test.

2. Description of the Related Art

In the field of semiconductor test, a probe card is used as an interface connected between a tester and devices under test (such as dies on a wafer). The primary structure of the probe card includes a circuit board (such as printed circuit board, also referred to as PCB) and a plurality of probes. Referring to FIG. 1 and FIG. 2, the circuit board 60, from an upper surface 61 or a lower surface 62 thereof, can be divided with a central region 63 (also called BGA region) located at the center of the circuit board 60, and a peripheral region 64 (also called pogo region) located adjacent to the periphery of the circuit board 60. The upper surface 61 of the circuit board 60 is a tester side. The contacts (not shown) located on the upper surface 61 of the circuit board 60 in the peripheral region 64 will be electrically connected to a tester (not shown). The lower surface 62 of the circuit board 60 is a device under test side. The contacts (not shown) located on the lower surface 62 of the circuit board 60 in the central region 63 will be electrically connected with the probes (not shown). In the testing task, the probes of the probe card are electrically connected with contacts (not shown) of the devices under test, so that the circuit board 60 receives the signal produced by the tester and then transmits it to the devices under test, or receives test results of the devices under test and then transmits the same to the tester.

From the vertical sectional view of the circuit board 60 as shown in FIG. 2, the circuit board 60 can be divided by function into a power layer 65 (also called PI layer) and signal layers 66 (also called SI layer), the circuit layouts of which are arranged in a vertically layered manner. When a test loop is to be established, the tester is electrically connected with the peripheral region 64 of the circuit board 60, and then a power signal is electrically connected from the peripheral region 64 to the central region 63 through the power layer 65 to provide the devices under test the power required for the test. Meanwhile, the contacts of the peripheral region 64 for transmitting test signals are electrically connected to the central region 63 through the signal layers 66 to transmit and/or receive electric signals of the devices under test.

Further speaking, the current power layers 65 are mostly configured by piling by layers in a GPPG manner. G refers to a ground plane of the power layer 65. P refers to a power plane of the power layer 65. In the current circuit board manufacturing process, circuits are formed layer by layer (such as in the sequence of the signal layer 66, the ground plane G of the power layer 65, the power plane P of the power layer 65, and so on), then a compression bonding process is performed, and at last drilling and plated through hole (also referred to as PTH) manufacturing processes are performed to electrically connect the circuits of each layer. Therefore, in the current condition that the circuits of the power layer 65 and signal layer 66 are formed in a single circuit board in a mixed piled arranging manner, when a drilling process for vertical through holes is performed, the situation that a signal conductive via 67 (for simplifying the figure, conductive vias are only represented by dotted lines in FIG. 2) penetrates through the power plane P of the power layer 65 often happens. Specifically speaking, in the peripheral region 64 of the circuit board 60, for ensuring that a power conductive via 68 can be electrically connected with the power plane P of the power layer 65 or the corresponding structure of GPPG, the GPPG structure of the power layer 65 is partially located in the peripheral region 64, so the situation that the signal conductive via 67 penetrates through the power plane P of the power layer 65 often happens. Such situation will cause damage to the power integrity of the power layer 65, lowering the power test uniformity of the power layer 65. Under this circumstance, for ensuring the power test uniformity of the power layer 65, the upper surface 61 of the circuit board 60 should be arranged with physical capacitors (not shown) for compensation, thereby ensuring the power test uniformity of the circuit board 60 for every device under test.

SUMMARY OF THE INVENTION

However, for saving time consumed for the test, the requirement for using the probe card to probe the devices under test lies in that for the amount of the devices under test probed in a single time, the more the better. For example, hypothesizing that the current probe card probes six devices under test in a single time, it will be developed in the direction of probing eight or more devices under test in a single time for raising the test efficiency to reduce time consumed for the test. In other words, the central region of the circuit board will be arranged with more probes, and contacts and circuits, which are electrically connected with the probes, for providing more test channels between devices under test and the tester.

For ensuring the power test uniformity of the above-described circuit board for every device under test, the upper surface of the circuit board should be arranged with space (surface area) for disposing the physical capacitors. Therefore, when the amount of the devices under test probed in a single time is increased, the probes and the contacts and circuits, which are electrically connected with the probes, required to be arranged in the central region of the circuit board need to occupy a relatively larger surface area of the circuit board, and meanwhile the amount of the physical capacitors should be also increased along therewith. However, the size of the circuit board is limited by the tester, so the size thereof cannot be changed freely. Such situation is a repeated challenge to the designer for the arrangeable area of the circuit board.

Besides, each power layer and signal layer of the circuit board is provided with copper to serve as circuit traces, but the power layer and the signal layer are quite different in area and position of the copper disposed thereon, which may cause a board warping problem when they are interconnected by compression bonding. In other words, for the conventional circuit board whose power layer and signal layer are disposed in a mixed manner, the board warping problem has to be considered in the circuit board manufacturing process. Therefore, for vertical position, the power layer needs to be disposed between two signal layers to ensure uniform stress during thermocompression bonding, so as to avoid the occurrence of the board warping problem.

However, the above-described manner of disposing the power layer between two signal layers makes the conductive via located in the central region of the circuit board from the power plane of the power layer to the device under test side of the circuit board have a quite length, which means the inductance of this conductive via is relatively larger. When the tester provides power to the devices under test, it is relatively more liable to bring resonance to cause the power undulation, resulting in unstable test results outputted by the devices under test. It lowers the power test uniformity of the conventional circuit board, so the amount of the physical capacitors arranged on the upper surface of the circuit board has to be increased to improve the power test uniformity.

Therefore, it is an objective of the present invention to provide a circuit board for semiconductor test, which satisfies the test requirement of multiple devices under test, and meanwhile can ensure the power test uniformity of the circuit board for every device under test even though the amount of physical capacitors arranged thereon is decreased.

To attain the above objective, the present invention provides a circuit board for semiconductor test, which includes a plurality of sub-circuit boards, and at least one insulating dielectric layer disposed between the sub-circuit boards. For example, the circuit board may include a first sub-circuit board, an insulating dielectric layer and a second sub-circuit board (i.e., the circuit board include two sub-circuit boards and an insulating dielectric layer), which are piled by layers from bottom to top. Alternatively, a third sub-circuit board and another insulating dielectric layer may be further piled from bottom to top between the aforementioned insulating dielectric layer and the second sub-circuit board (i.e., the circuit board include three sub-circuit boards and two insulating dielectric layers). Each of the sub-circuit boards includes a substrate formed of dielectric material, and a plurality of circuits formed of conductive material in the substrate for transmitting a test signal and a power signal provided by a tester to a probe head. The substrate has an upper surface and a lower surface. The circuits include a plurality of upper contacts located on the upper surface, and a plurality of lower contacts located on the lower surface and electrically connected with the upper contacts. The insulating dielectric layer includes a plurality of through holes, and a plurality of connecting conductors disposed in the through holes. Each of the connecting conductors is electrically connected with the upper contact of one of the sub-circuit boards and the lower contact of another of the sub-circuit boards. The circuit board is defined with a central region and a peripheral region. A plurality of the lower contacts of the first sub-circuit board are located in the central region and adapted to be electrically connected with the probe head. A plurality of the upper contacts of the second sub-circuit board are located in the peripheral region and adapted to be electrically connected with the tester. The pitch between two adjacent upper contacts of the second sub-circuit board located in the peripheral region is larger than the pitch between two adjacent lower contacts of the first sub-circuit board located in the central region The amount of the upper contacts of the second sub-circuit board located in the peripheral region is larger than the amount of the lower contacts of the first sub-circuit board located in the peripheral region.

Besides, the dielectric constant of the material of the substrate of the first sub-circuit board may be larger than the dielectric constant of the material of the substrate of the second sub-circuit board. Alternatively, the thickness of the substrate of the first sub-circuit board may be larger than the thickness of the substrate of the second sub-circuit board. Preferably, the aforesaid two features may exist at the same time.

In the above-described condition that the third sub-circuit board is further included, the dielectric constant of the material of the substrate of the third sub-circuit board may be smaller than the dielectric constant of the material of the substrate of the first sub-circuit board and larger than the dielectric constant of the material of the substrate of the second sub-circuit board. Alternatively, the thickness of the substrate of the third sub-circuit board may be smaller than the thickness of the substrate of the first sub-circuit board and larger than the thickness of the substrate of the second sub-circuit board. Preferably, the aforesaid two features may exist at the same time. In other words, the lower the sub-circuit board is, the larger the dielectric constant of the material and/or thickness of the substrate thereof is.

As a result, according to the number of the layers of the circuit board required for the semiconductor test, the present invention may use an insulating dielectric layer to connect two sub-circuit boards, use two insulating dielectric layers to connect three sub-circuit boards, or use more than two insulating dielectric layers to connect more than three sub-circuit boards, so as to compose a multi-layer circuit board. In other words, the sub-circuit boards are firstly complete in manufacture to have transverse conductive traces and vertical conductive vias (all belong to the aforementioned circuits), and then the sub-circuit boards are combined together by the insulating dielectric layer so that the circuits of different sub-circuit boards are electrically connected with each other. For such circuit board, the vertical conductive vias are relatively shorter, so the problems of the conductive vias being difficult to be provided and having long stubs can be avoided. Besides, using the insulating dielectric layer for the bonding of the vertical conductive vias of two sub-circuit boards and the electrical connection between the corresponding contacts of two sub-circuit boards can ensure the yield rate of the manufacture of the circuit board of the present invention. Besides, the present invention can use the first sub-circuit board, which has the largest thickness, to serve as a base of the circuit board, so that it is relatively easier to maintain the flatness of the base. When piling and combining the sub-circuit boards by the insulating dielectric layer, the occurrence of bad-flatness situations such as board bending or board warping can be avoided, so that the yield rate of the circuit board can be raised. In addition, the substrates of the different sub-circuit boards are different in the dielectric constant of the material thereof, which is beneficial to separately arrange the circuits for different purposes or requirements on different sub-circuit boards. The arrangement that the pitch between the adjacent upper contacts of the second sub-circuit board located in the peripheral region is larger than the pitch between the adjacent lower contacts of the first sub-circuit board located in the central region can make signal outputting members of the tester relatively easier to contact the upper contacts of the second sub-circuit board located in the peripheral region respectively, so as to avoid short circuit.

Further speaking, the present invention uses the first sub-circuit board for the circuit layout directed to power integrity and the second sub-circuit board for the circuit layout directed to signal integrity, such that the test signal and the power signal can be prevented from interference with each other. Compared with the conventional structure that the power layer and signal layer are disposed in a single circuit board in a mixed manner, in the structure of the circuit board of the present invention two or more than two sub-circuit boards are manufactured separately and thereafter connected by the insulating dielectric layer. The first sub-circuit board, which is located closest to the devices under test, serves as a PI sub-board for power circuits mainly. The second sub-circuit board, which is located closest to the tester, serves as an SI sub-board for signal circuits mainly. Therefore, when processing the vertical through holes of the conductive vias, the PI sub-board and the SI sub-board are drilled separately. Therefore, compared with the conventional condition that the power layer and signal layer are disposed in a single circuit board in the mixed manner and drilled together, the present invention can highly reduce the situation that the conductive via for transmitting the test signal penetrates through a power plane, so as to generate relatively better power test uniformity, so that the upper surface of the circuit board can be arranged with a relatively smaller amount of physical capacitors. When the size of the circuit board is not increased, the power test uniformity of the circuit board can be also ensured. Because the SI sub-board is located close to the tester and the PI sub-board is located close to the devices under test, the vertical conductive vias of the SI sub-board located in the peripheral region for transmitting the test signal mostly have no need to be connected with the vertical conductive vias of the PI sub-board located in the peripheral region. Therefore, the amounts of the upper and lower contacts of the second sub-circuit board located in the peripheral region are larger than the amounts of the upper and lower contacts of the first sub-circuit board located in the peripheral region. This feature can prevent the PI sub-board from the problem that the vertical conductive via provided in the peripheral region for transmitting the test signal penetrates through the power plane, so as to ensure the power test uniformity of the circuit board.

Besides, because the circuit board of the present invention is divided into the above-described PI sub-board and SI sub-board, copper layers provided in the PI sub-board are similar in area and position to each other, and copper layers provided in the SI sub-board are similar in area and position to each other. Therefore, the single sub-circuit board can be prevented from the board warping problem. The arrangement of the PI sub-board at the position closest to the devices under test causes that in the central region of the circuit board, the vertical conductive vias of the PI sub-board between the power plane thereof and the device under test side of the circuit board for transmitting the power signal can be as shortened in length as possible. Therefore, compared with the above-described conventional single circuit board, the PI sub-board of the present invention has the vertical conductive vias with lower inductance for transmitting the power signal, which is less possible to bring resonance when the tester provides power to the devices under test, so that the test results outputted by the devices under test are more stable, resulting in better power test uniformity. Therefore, the upper surface of the circuit board can be arranged with a relatively smaller amount of physical capacitors.

The detailed structure, features, assembly or usage of the circuit board for semiconductor test provided by the present invention will be described in the following detailed description of embodiments. However, those skilled in the field of the present invention should understand that the detailed descriptions and specific embodiments instanced for implementing the present invention are given by way of illustration only, not intended to limit the scope of the claims of the present invention.

DETAILED DESCRIPTION OF THE INVENTION

Figure 1:
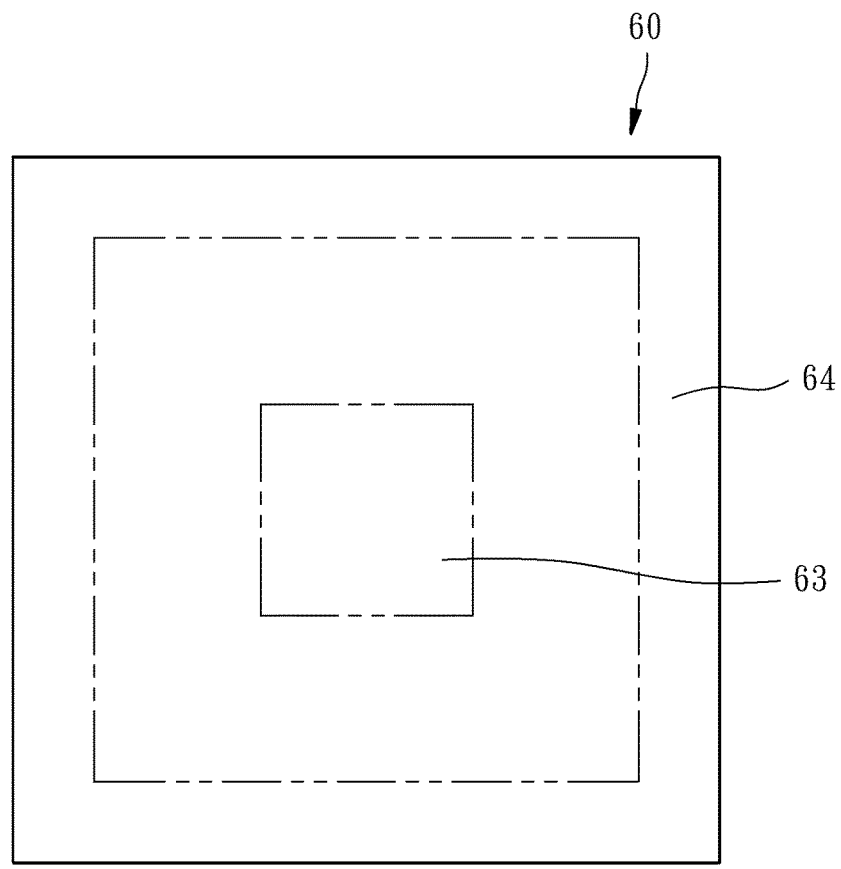
FIG. 1 and FIG. 2 are a schematic planar view and a schematic sectional view of a conventional circuit board for semiconductor test respectively.
Figure 2:
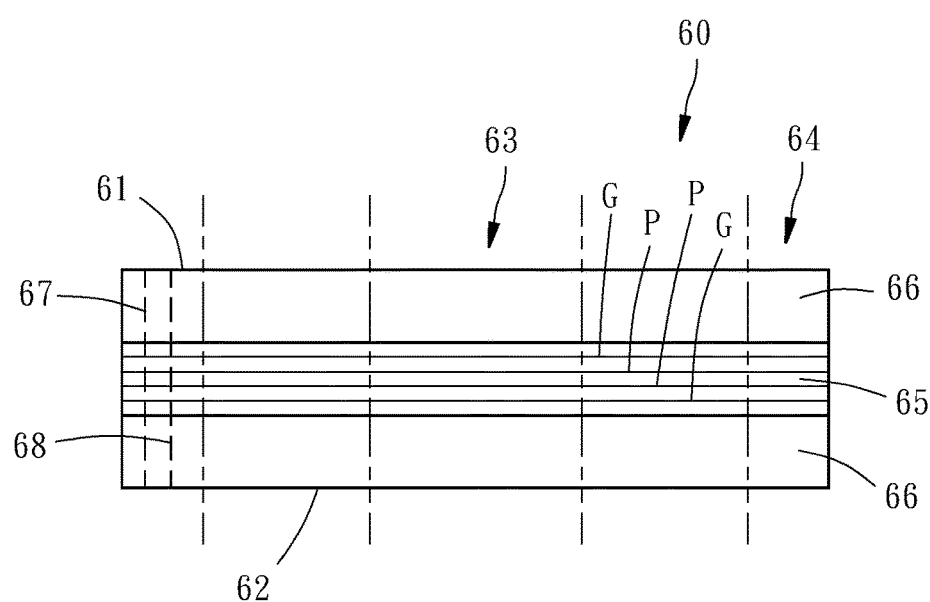

First of all, it is to be mentioned that same reference numerals used in the following embodiments and the appendix drawings designate same or similar elements or the structural features thereof. It should be noticed that for the convenience of illustration, the components and the structure shown in the figures are not drawn according to the real scale and amount, and the features mentioned in each embodiment can be applied in the other embodiments if the application is possible in practice.

Figure 3:
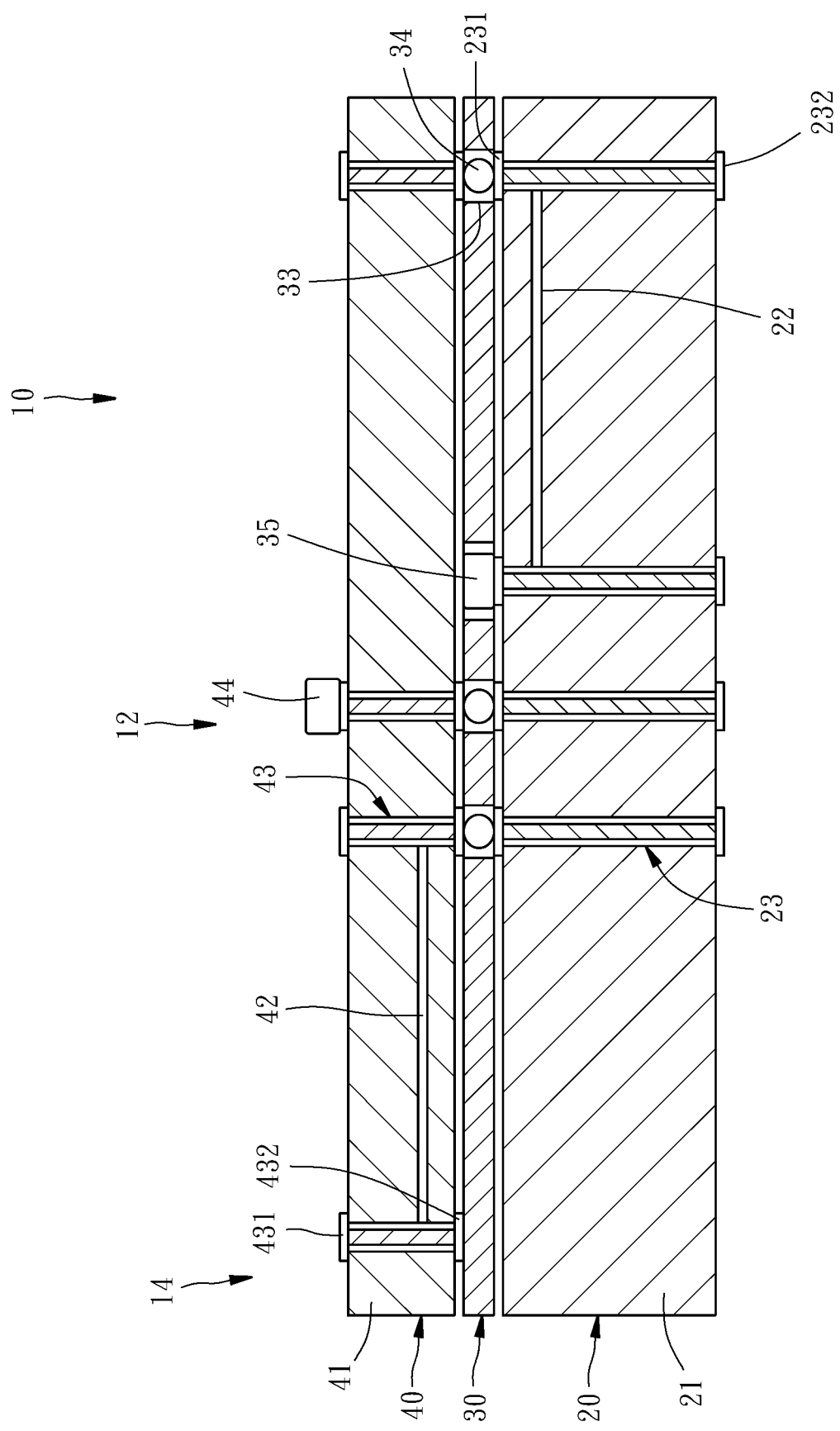
FIG. 3 is a schematic sectional view of a circuit board for semiconductor test according to a first preferred embodiment of the present invention.
Figure 4:
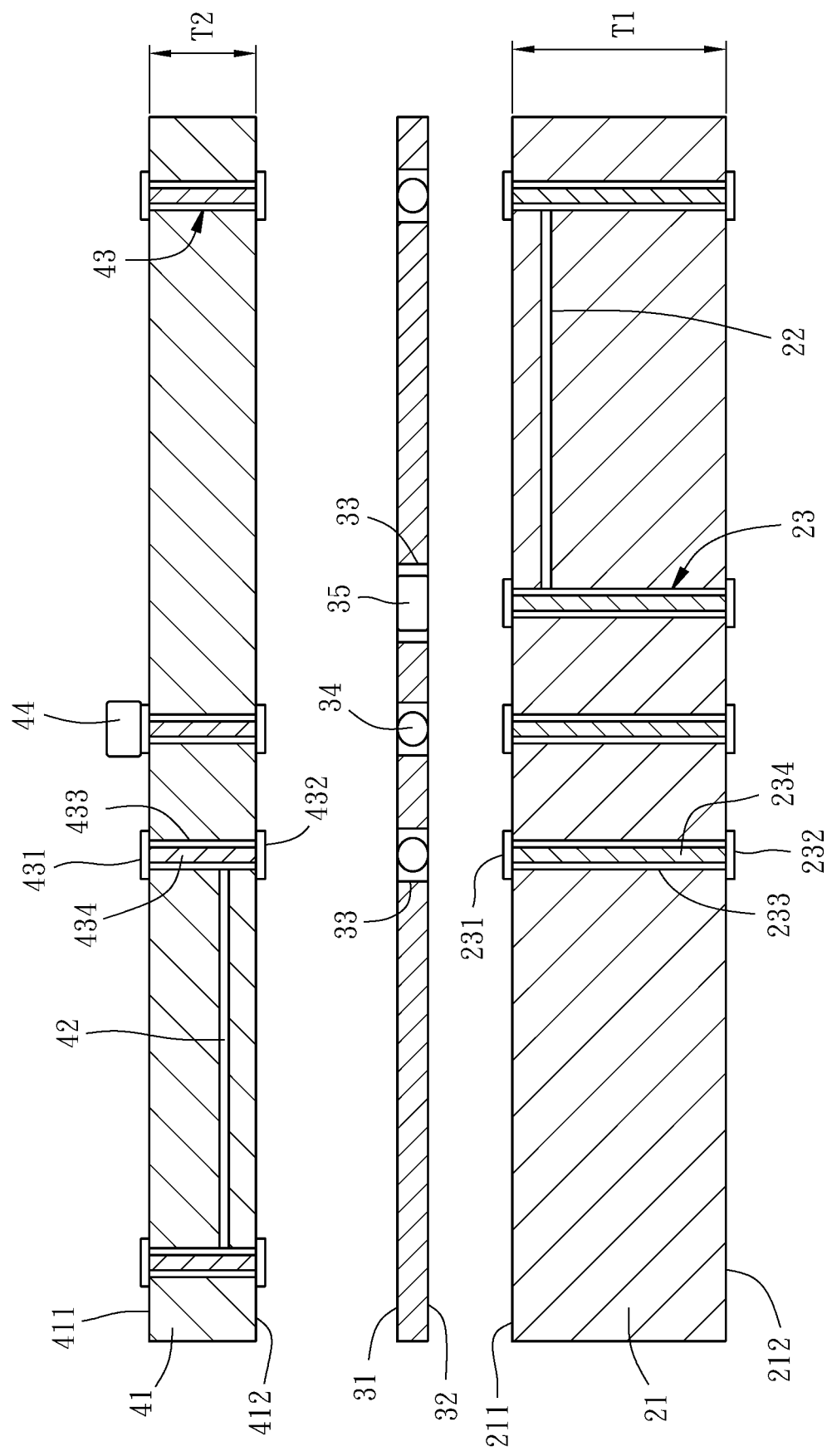
FIG. 4 is an exploded view of FIG. 3.

Referring to FIG. 3 and FIG. 4, a circuit board 10 for semiconductor test according to a first preferred embodiment of the present invention includes a first sub-circuit board 20, an insulating dielectric layer 30, and a second sub-circuit board 40, which are piled by layers from bottom to top.

The first sub-circuit board 20 includes a substrate 21 formed of dielectric material, and a plurality of circuits formed of conductive material in the substrate 21. The circuits include a plurality of transverse conductive traces 22 (unlimited in amount, only one of them is shown in the figures), and a plurality of vertical conductive vias 23. Specifically speaking, the first sub-circuit board 20 is a multi-layer circuit board composed of multiple layers of base materials by compression bonding. The partial base materials thereof are provided on the interconnecting surfaces thereof with the transverse conductive traces 22. In other words, the substrate 21 is practically composed of the multiple layers of base materials, but for simplifying the figures, the substrate 21 is drawn as an integral whole in the figures of the present invention except FIG. 6. After the manufacture of the substrate 21 and the transverse conductive traces 22 is accomplished, the vertical conductive vias 23 are then provided. The vertical conductive vias 23 are usually plated through holes, which are provided in a way that the substrate 21 is firstly drilled with through holes penetrating through an upper surface 211 and a lower surface 212 thereof by a manner such as mechanical drilling or laser drilling, and then inner surfaces of the through holes and openings of two ends of the through holes are plated with copper. In this way, each vertical conductive via 23 includes an upper contact 231 located on the upper surface 211, a lower contact 232 located on the lower surface 212, and a conductive inner wall 233 electrically connected with the upper contact 231 and the lower contact 232. Besides, each vertical conductive via 23 may further include an insulator 234 stuffed in an inner space thereof. Two ends of each transverse conductive trace 22 are each connected with the conductive inner wall 233 of a vertical conductive via 23, so that the upper and lower contacts 231 and 232 not located on a same vertical axis can be electrically connected with each other by the transverse conductive trace 22.

The second sub-circuit board 40 is similar to the first sub-circuit board 20, including a substrate 41 formed of dielectric material, and a plurality of circuits formed of conductive material in the substrate 41. The circuits include a plurality of transverse conductive traces 42 (unlimited in amount, only one of them is shown in the figures), and a plurality of vertical conductive vias 43. In other words, the substrate 41 is practically composed of multiple layers of base materials, but for simplifying the figures, the substrate 41 in the present invention is drawn as an integral whole. Each vertical conductive via 43 includes an upper contact 431 located on an upper surface 411 of the substrate 41, a lower contact 432 located on a lower surface 412 of the substrate 41, a conductive inner wall 433 electrically connected with the upper contact 431 and the lower contact 432, and an insulator 434 stuffed in an inner space thereof. Two ends of each transverse conductive trace 42 are each connected with the conductive inner wall 433 of a vertical conductive via 43, so that the upper and lower contacts 431 and 432 not located on a same vertical axis can be electrically connected with each other by the transverse conductive trace 42.

The insulating dielectric layer 30 includes an upper surface 31 connected with the second sub-circuit board 40, a lower surface 32 connected with the first sub-circuit board 20, a plurality of through holes 33 penetrating through the upper surface 31 and the lower surface 32, and a plurality of connecting conductors 34 disposed in the through holes 33. Each through hole 33 corresponds in position to the vertical conductive vias 23 and 43 of the first and second sub-circuit boards 20 and 40. Each connecting conductor 34 is electrically connected with the upper contact 231 of the first sub-circuit board 20 and the lower contact 432 of the second sub-circuit board 40, which are located on a same vertical axis. Besides, the partial through hole 33 of the insulating dielectric layer 30 can accommodate an electronic component 35. The electronic component 35 may or may not need to be electrically connected with the upper contact 231 of the first sub-circuit board 20 and the lower contact 432 of the second sub-circuit board 40 at the same time. For example, the electronic component 35 shown in FIG. 1 is only electrically connected with the upper contact 231 of the first sub-circuit board 20. Therefore, the upper contacts 231 of the first sub-circuit board 20 and the lower contacts 432 of the second sub-circuit board 40 may be not correspond one to one. In addition, the upper contact 431 of the second sub-circuit board 40 may be electrically connected with an electronic component 44. The electronic components 35 and 44 may be capacitors, inductors, resistors, radio-frequency components, connectors, relays, and so on, which can be disposed according to requirements.

The circuit board 10 of the present invention is primarily used for semiconductor test, which means serving as a main circuit board of a probe card. The circuit layouts of the first and second sub-circuit boards 20 and 40 and the arrangement of the connecting conductors 34 of the insulating dielectric layer 30 can cause the circuit board 10 signal transmitting paths and impedance matching ground circuits, which meet the test requirement. For the simplification of figures and convenience of illustration, only a small number of circuits are schematically drawn in the figures of the present invention. Compared with the thickness of the entire circuit board 10, the thickness of each sub-circuit board 20 or 40 is much smaller, so the vertical conductive vias 23 and 43 thereof are so short as to avoid problems of difficulty in disposing the conductive vias and long stubs.

Figure 5:
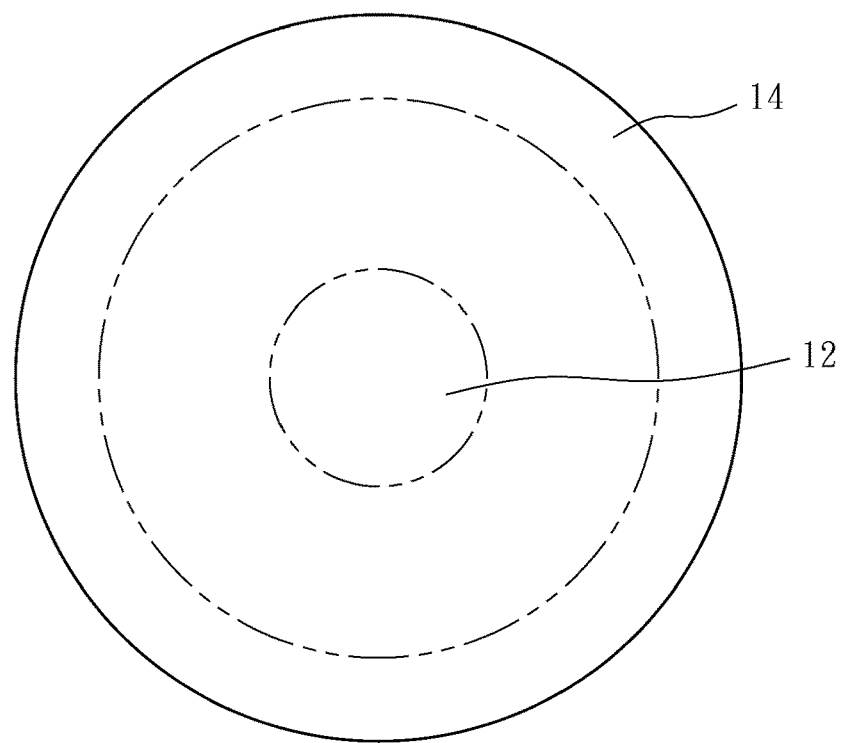
FIG. 5 is a schematic top view of the circuit board.

Referring to FIG. 3 and FIG. 5, the circuit board 10 is defined with a central region 12 and a peripheral region 14. FIG. 5 only schematically shows that the circuit board 10 may be circular, wherein the central region 12 and the peripheral region 14 are approximately demarcated by imaginary lines. Other components and features of the circuit board 10 are not shown in FIG. 5. The circuit board of the present invention may be square-shaped as that shown in FIG. 1. The lower contacts 232 of the first sub-circuit board 20 are mostly located in the central region 12 for being electrically connected with a probe head (not shown) directly, or electrically connected with the probe head through a space transformer (not shown), so that a probe card is composed. The upper contacts 431 of the second sub-circuit board 40 are mostly located in the peripheral region 14 for being electrically connected with a tester (not shown), so that power signals and test signals provided by the tester are transmitted to a device under test (not shown) through probes of the aforementioned probe head. In other words, the top side of the circuit board 10 (i.e., the upper surface 411 of the second sub-circuit board 40) is a tester side facing toward the tester, and the bottom side of the circuit board 10 (i.e., the lower surface 212 of the first sub-circuit board 20) is a device under test side (wafer side) facing toward the device under test (such as wafer). The tester provides power and test signals to the upper contacts 431 located in the peripheral region 14. Then the power and test signals are transmitted to the lower contacts 232 located in the central region 12 through the circuits of the second sub-circuit board 40, the connecting conductors 34 of the insulating dielectric layer 30 and the circuits of the first sub-circuit board 20 in order, so as to be transmitted to the device under test through the probe head. The pitch between two adjacent upper contacts 431 of the second sub-circuit board 40 located in the peripheral region 14 is larger than the pitch between two adjacent lower contacts 232 of the first sub-circuit board 20 located in the central region 12. Such arrangement can make signal outputting members of the tester (such as elastic contacting members commonly known as pogo pins) relatively easier to contact the upper contacts 431 of the second sub-circuit board 40 located in the peripheral region 14 respectively, so as to avoid short circuits. Furthermore, the lower contacts 232 of the first sub-circuit board 20 are mostly located in the central region 12 for being electrically connected with the probe head directly, which means the first sub-circuit board 20 is the bottom side sub-circuit board of the circuit board 10. The upper contacts 431 of the second sub-circuit board 40 are mostly located in the peripheral region 14 for being electrically connected with the tester, which means the second sub-circuit board 40 is the top side sub-circuit board of the circuit board 10.

For benefiting the achievement of the above-described power and test signals transmitting effect, the amount of the upper contacts 431 of the second sub-circuit board 40 located in the peripheral region 14 is larger than the amount of the lower contacts 232 of the first sub-circuit board 20 located in the peripheral region 14, the amount of the upper contacts 431 of the second sub-circuit board 40 located in the central region 12 is smaller than the amount of the lower contacts 232 of the first sub-circuit board 20 located in the central region 12, the total amount of the upper contacts 431 of the second sub-circuit board 40 is smaller than the total amount of the lower contacts 232 of the first sub-circuit board 20, and the amount of the lower contacts 232 of the first sub-circuit board 20 located in the central region 12 is larger than the amount of the lower contacts 232 of the first sub-circuit board 20 located in the peripheral region 14.

In the present invention, the thickness T1 of the substrate 21 of the first sub-circuit board 20 may be larger than or equal to the thickness T2 of the substrate 41 of the second sub-circuit board 40, and the arrangement provided in this embodiment that the thickness T1 is larger than the thickness T2 is preferred. Besides, the dielectric constant of the material of the substrate 21 of the first sub-circuit board 20 may (but unlimited to) be larger than the dielectric constant of the material of the substrate 41 of the second sub-circuit board 40. Such feature is beneficial to separately arrange circuits for different purposes or requirements on different sub-circuit boards, and the materials different in dielectric constant have different colors, thereby recognizable from the appearance.

Further speaking, the present invention uses the first sub-circuit board 20 for the circuit layout directed to power integrity (also referred to as PI) and the second sub-circuit board 40 for the circuit layout directed to signal integrity (also referred to as SI). Therefore, the first sub-circuit board 20 is also called PI sub-board, and the second sub-circuit board 40 is also called SI sub-board. That means, the transverse conductive traces 42 of the second sub-circuit board 40 are mostly used for test signal paths, but may be partially used for secondary power paths. The transverse conductive traces 22 of the first sub-circuit board 20 are mostly used for primary power paths, so that the primary power paths are mostly located close to the device under test. This is beneficial to the test for application processor (also referred to as AP) chips of cell phones.

In other words, the vertical conductive vias 43 of the second sub-circuit board 40 located in the peripheral region 14 for transmitting the test signal are mostly electrically connected with the vertical conductive vias 43 located in the central region 12 through the transverse conductive traces 42. The vertical conductive vias 43 of the second sub-circuit board 40 located in the peripheral region 14 for transmitting the power signal are mostly not connected with the transverse conductive trace 42, which means a few of the transverse conductive traces 42 and the vertical conductive vias 43 located in the central region 12 (but may be none of them) may be used for transmitting the power signal. Therefore, the amounts of the upper and lower contacts 431 and 432 of the second sub-circuit board 40 located in the central region 12 for transmitting the test signal are larger than the amounts of the upper and lower contacts 431 and 432 of the second sub-circuit board 40 located in the central region 12 for transmitting the power signal (these amounts may be zero). On the other hand, among the vertical conductive vias 43 of the second sub-circuit board 40 located in the peripheral region 14, those electrically connected with the vertical conductive vias 23 of the first sub-circuit board 20 located in the peripheral region 14 through the insulating dielectric layer 30 are mostly used for transmitting the power signal and transmitting the power signal to the vertical conductive vias 23 located in the central region 12 through the transverse conductive traces 22 of the first sub-circuit board 20, which means a few of the transverse conductive traces 22 and the vertical conductive vias 23 located in the peripheral region 14 (but may be none of them) may be used for transmitting the test signal. Therefore, the amounts of the upper and lower contacts 231 and 232 of the first sub-circuit board 20 located in the peripheral region 14 for transmitting the power signal are larger than the amounts of the upper and lower contacts 231 and 232 of the first sub-circuit board 20 located in the peripheral region 14 for transmitting the test signal (these amounts may be zero). Besides, the amounts of the upper and lower contacts 431 and 432 of the second sub-circuit board 40 located in the peripheral region 14 for transmitting the test signal are larger than the amounts of the upper and lower contacts 431 and 432 of the second sub-circuit board 40 located in the peripheral region 14 for transmitting the power signal. In practice, after the manufacture of the circuit board is accomplished, the upper contacts 431 of the second sub-circuit board 40 and the lower contacts 232 of the first sub-circuit board 20 can be measured by a ducter for determining that each contact is used for transmitting the power signal or transmitting the test signal. For example, the contacts having the impedance smaller than 100 milliohms (m$\Omega$) are those transmitting the power signal, and the other contacts are those transmitting the test signal. By the statistics of the amounts of the contacts according to the measurement in this manner, the above-described comparisons between the amounts of the upper and lower contacts of the first and second sub-circuit boards located in the central and peripheral regions for transmitting the power signal and test signal can be performed.

As regards the above-described upper contacts 431 of the second sub-circuit board 40 located in the peripheral region 14 for transmitting the power signal or transmitting the test signal, the tester has fixed positions for transmitting the power signal or transmitting the test signal. Therefore, as long as the figure with the positions for transmitting the power signal or transmitting the test signal corresponding to the model number of the adopted tester or the data which can illustrate the corresponding signals is obtained, the positions of the corresponding upper contacts 431 of the second sub-circuit board 40 located in the peripheral region 14 for transmitting the power signal or transmitting the test signal can be determined.

As regards the above-described circuit design of the vertical conductive vias 23 and 43, the stub of the conductive via 43 can be removed by a back drill processing, or the board thicknesses of the first and second sub-circuit boards can be controlled to prevent the vertical conductive vias 23 and 43 from being formed with stubs, so as to avoid the deterioration of high-frequency loss during high-frequency high-speed testing.

Speaking of the transverse conductive traces, the amount of the transverse conductive trace 22 of the first sub-circuit board 20 for transmitting the power signal is larger than the amount of the transverse conductive trace 22 of the first sub-circuit board 20 for transmitting the test signal (this amount may be zero). The amount of the transverse conductive trace 42 of the second sub-circuit board 40 for transmitting the test signal is larger than the amount of the transverse conductive trace 42 of the second sub-circuit board 40 for transmitting the power signal (this amount may be zero).

Because the circuit layout directed to power integrity and the circuit layout directed to signal integrity are separately made on two sub-circuit boards, i.e., the PI sub-board 20 and the SI sub-board 40, it can avoid that the vertical conductive via 43 of the SI sub-board 40 penetrates through a power layer of the PI sub-board 20. Therefore, compared with the conventional condition that the power layer and the signal layer are disposed in a single circuit board in a mixed manner, the present invention can generate better power test uniformity, so that the amount of physical capacitors required to be arranged can be smaller. Further speaking, because the SI sub-board 40 is located close to the tester and the PI sub-board 20 is located close to the device under test, the vertical conductive vias 43 of the SI sub-board 40 located in the peripheral region 14 for transmitting the test signal mostly have no need to be connected with the vertical conductive via 23 of the PI sub-board 20 located in the peripheral region 14. Therefore, the amounts of the upper and lower contacts 431 and 432 of the second sub-circuit board 40 located in the peripheral region 14 are larger than the amounts of the upper and lower contacts 231 and 232 of the first sub-circuit board 20 located in the peripheral region 14. This feature can prevent the PI sub-board 20 from the problem of the vertical conductive via thereof located in the peripheral region 14 for transmitting the test signal penetrating through the power plane, so as to ensure the power test uniformity of the circuit board. Besides, using the insulating dielectric layer 30 for the bonding of the vertical conductive vias of two sub-circuit boards and the electrical connection between the corresponding contacts of two sub-circuit boards can ensure the yield rate of the manufacture of the circuit board of the present invention. In addition, copper layers provided in the PI sub-board 20 are similar in area and position to each other, and copper layers provided in the SI sub-board 40 are similar in area and position to each other. Therefore, the single sub-circuit board can be prevented from the board warping problem. Because the PI sub-board 20 is arranged at the position closest to the device under test, in the central region of the circuit board, the vertical conductive via of the PI sub-board 20 between the power plane thereof and the device under test side of the circuit board for transmitting the power signal can be as shortened in length as possible, so that the inductance thereof is so small as to be less possibly bring resonance when the tester provides power to the device under test, resulting in stable test results outputted by the device under test and the resultant great power test uniformity. Therefore, the upper surface of the circuit board can be arranged with a relatively smaller amount of physical capacitors.

Figure 6:
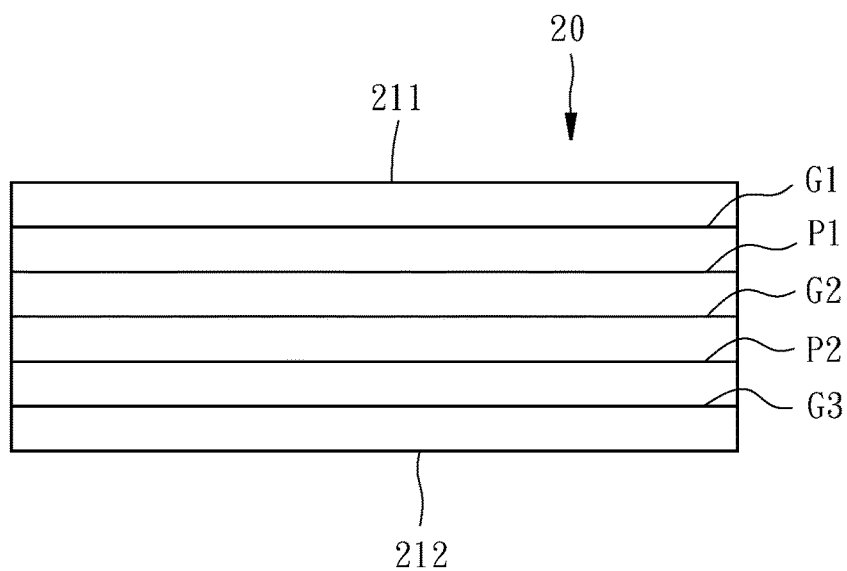
FIG. 6 is a schematic sectional view of a first sub-circuit board of the circuit board.

Besides, the first sub-circuit board 20 is relatively larger in thickness, so the transverse conductive trace 22 thereof can be designed with two or more piled layers for benefitting the electrical properties of the primary power paths. For example, as shown in FIG. 6, the first sub-circuit board 20 may include a first ground layer G1, a first power layer P1, a second ground layer G2, a second power layer P2 and a third ground layer G3, which are arranged in a piled manner in order from the upper surface 211 to the lower surface 212, and this arrangement is also called GPGPG structure hereinafter. As described above, the first sub-circuit board 20 is composed of multiple layers of base materials by compression bonding. The aforementioned ground layers G1-G3 and power layers P1-P2 are conductive layers provided on the interconnecting surfaces of the base materials. For the simplification of the figure and convenience of illustration, in FIG. 6, each of the aforementioned ground layers G1-G3 and power layers P1-P2 is only represented by a straight line and other members and features of the first sub-circuit board 20 are not shown. In this GPGPG structure, the effect of equivalent capacitance can be produced between the first ground layer G1 and the second ground layer G2, and between the second ground layer G2 and the third ground layer G3, thereby raising the effect of equivalent capacitance of the PI sub-board 20. This is also beneficial to the power test uniformity, so as to reduce the amount of the physical capacitors used thereon. In addition to the above-described advantage, this GPGPG structure also causes the PI sub-board 20 a relatively larger thickness, so the PI sub-board 20 can be recognized from the appearance thereof that it has the GPGPG structure. Furthermore, the present invention uses the first sub-circuit board 20 with the relatively larger thickness as a base of the circuit board 10, so that it is relatively easier to maintain the flatness of the base. When piling and bonding the second sub-circuit board 40 by the insulating dielectric layer 30, the occurrence of bad-flatness situations such as board bending or board warping can be avoided, so that the yield rate of the circuit board can be raised 10.

On the other hand, the conventional single circuit board having the structure layered in a GPPG manner and used for six devices under test approximately has 80 layers. If the above-described GPGPG structure is to be applied to the single circuit board and the probe card is to be developed in the direction of probing eight or more devices under test in a single time, it will cause the circuit board the number of piled layers up to 100 or more. According to the current compression bonding technique for piling layers of the circuit board, the circuit board should be provided with conductive vias, such as plated through holes, penetrating through top and bottom surfaces thereof. Limited by drilling technique and the aspect ratio of depth to width, the more the layers of the circuit board are, the larger the thickness is, and the higher the difficulty of drilling is. It may be even unable to be drilled under specific size requirements. Besides, the deeper the through hole, the larger the width, with which the through hole should be drilled, so that it is hard to shorten the pitch between the centers of the adjacent through holes, thereby hard to meet the test requirement of fine pitch. From this it can be known that the manner of the present invention that the PI sub-board 20 and the SI sub-board 40 are separately manufactured and then connected by the insulating dielectric layer 30 is more suitable than the conventional circuit board to adopt the GPGPG structure.

Besides, disposing the PI circuit layout and the SI circuit layout on different sub-circuit boards respectively can prevent the test signal and the power signal from interference with each other, and disposing the PI circuit layout on the first sub-circuit board 20 whose material of substrate has the relatively larger dielectric constant can reduce the required number of capacitors. In addition, the circuit board 10 can use the first sub-circuit board 20 with large thickness as the base, so that it is relatively easier to maintain the flatness of the base. When piling and bonding the second sub-circuit board 40 by the insulating dielectric layer 30, the occurrence of bad-flatness situations such as board bending or board warping can be avoided, so that the yield rate of the circuit board 10 can be raised. The feature that the first sub-circuit board 20 is relatively larger in thickness is unlimited to be achieved by the above-described GPGPG structure. For example, the thickness of the power layer of the first sub-circuit board 20 can be increased, thereby not only increasing the thickness of the first sub-circuit board 20 but also lowering the impedance value of the power circuit, which can also achieve the effect of raising the power uniformity.

Figure 7:
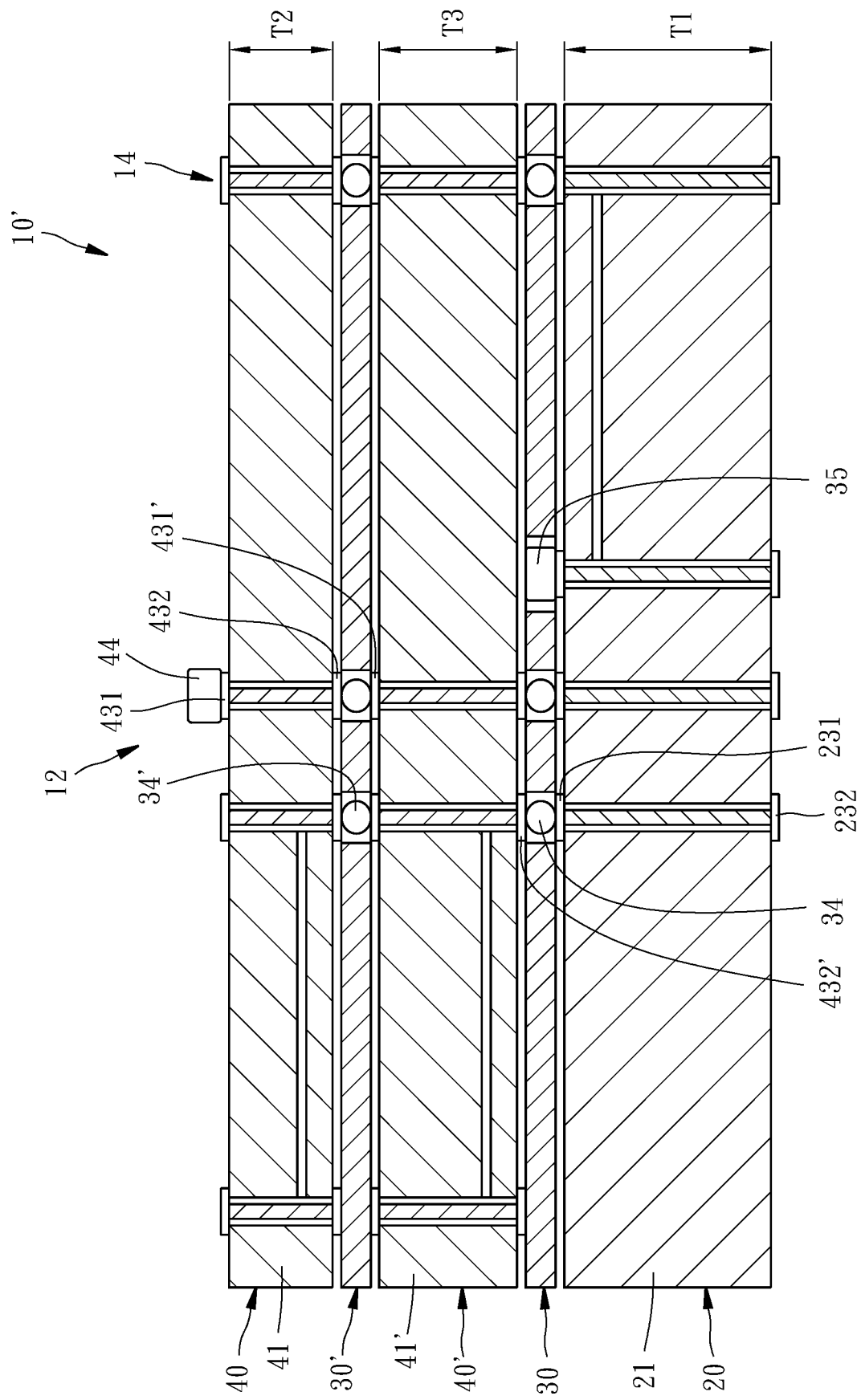
FIG. 7 is a schematic sectional view of a circuit board for semiconductor test according to a second preferred embodiment of the present invention.

According to the number of layers of the circuit board required for the semiconductor test, the present invention may use more than one insulating dielectric layer to connect more than two sub-circuit boards. For example, a circuit board 10' according to a second preferred embodiment of the present invention as shown in FIG. 7 is similar to the above-described circuit board 10, but a third sub-circuit board 40' and another insulating dielectric layer 30' are further piled between the insulating dielectric layer 30 and the second sub-circuit board 40, which means the circuit board 10' includes three sub-circuit boards and two insulating dielectric layers. The insulating dielectric layer 30' and the third sub-circuit board 40' are structurally similar to the above-described insulating dielectric layer 30 and second sub-circuit board 40 respectively, thereby not repeatedly described hereinbelow, and the structural features of the insulating dielectric layer 30' and third sub-circuit board 40' are partially not marked with reference numerals in the figure. The thickness T3 of the substrate 41' of the third sub-circuit board 40' is smaller than the thickness T1 of the substrate 21 of the first sub-circuit board 20 and larger than the thickness T2 of the substrate 41 of the second sub-circuit board 40. The dielectric constant of the material of the substrate 41' of the third sub-circuit board 40' is smaller than the dielectric constant of the material of the substrate 21 of the first sub-circuit board 20 and larger than the dielectric constant of the material of the substrate 41 of the second sub-circuit board 40. The insulating dielectric layer 30 is disposed between the first sub-circuit board 20 and the third sub-circuit board 40'. The connecting conductor 34 of the insulating dielectric layer 30 is electrically connected with the upper contact 231 of the first sub-circuit board 20 and the lower contact 432' of the third sub-circuit board 40', which are located on a same vertical axis. The insulating dielectric layer 30' is disposed between the second sub-circuit board 40 and the third sub-circuit board 40'. The connecting conductor 34' of the insulating dielectric layer 30' is electrically connected with the upper contact 431' of the third sub-circuit board 40' and the lower contact 432 of the second sub-circuit board 40, which are located on a same vertical axis.

In the circuit board 10 as shown in FIG. 3 or the circuit board 10' as shown in FIG. 7, the first sub-circuit board 20 may be a low-impedance power signal substrate. The thickness thereof is the largest, which is beneficial to maintain the flatness of the circuit board, and the dielectric constant thereof is the highest, which is beneficial to control capacitive reactance of capacitors for providing low power impedance, so that the power signal transmission will not attenuate. The second sub-circuit board 40 may be a high-speed signal substrate, the dielectric constant of which is the lowest, which is beneficial to control capacitive reactance of capacitors for providing high impedance matching, so that the test signal transmission will not attenuate. As a result, the circuit board of the present invention can attain the requirement of high-frequency high-speed testing and the requirement of power transmission and supply to the device under test, and can lower the power interference of the power layer resulted from high-speed signal passing therethrough. The third sub-circuit board 40' of the circuit board 10' as shown in FIG. 7 may be a low-speed signal and power circuit substrate, which is primarily used for disposing the circuits for medium and low frequency signals which are lower in the required impedance than the high-speed signal, and the circuits for the secondary power signal which is higher in the required impedance than the main power signal.

At last, it should be mentioned again that the constituent elements disclosed in the above embodiments of the present invention are only taken as examples for illustration, not intended to limit the scope of the present invention. The substitution or variation of other equivalent elements should be included within the scope of the following claims of the present invention.

What is claimed is:

1. A circuit board for semiconductor test comprising:
a plurality of sub-circuit boards, each of the sub-circuit boards comprising a substrate formed of dielectric material, and a plurality of circuits formed of conductive material in the substrate for transmitting a test signal and a power signal provided by a tester to a probe head, the substrate having an upper surface and a lower surface, the circuits comprising a plurality of upper contacts located on the upper surface, and a plurality of lower contacts located on the lower surface and electrically connected with the upper contacts; and
at least one insulating dielectric layer disposed between the sub-circuit boards, the insulating dielectric layer comprising a plurality of through holes, and a plurality of connecting conductors disposed in the through holes, each of the connecting conductors being electrically connected with the upper contact of one of the sub-circuit boards and the lower contact of another of the sub-circuit boards;
wherein the circuit board is defined with a central region and a peripheral region; the plurality of sub-circuit boards comprises a first sub-circuit board, and a second sub-circuit board located above the first sub-circuit board; a plurality of the lower contacts of the first sub-circuit board are located in the central region and adapted to be electrically connected with the probe head; a plurality of the upper contacts of the second sub-circuit board are located in the peripheral region and adapted to be electrically connected with the tester; a pitch between two adjacent said upper contacts of the second sub-circuit board located in the peripheral region is larger than a pitch between two adjacent said lower contacts of the first sub-circuit board located in the central region;
wherein the upper contacts of the second sub-circuit board located in the periphery region comprise at least one upper contact for transmitting a power signal and at least one upper contact for transmitting a test signal, the lower contacts of the first sub-circuit board located in the periphery region comprise at least one lower contact electrically connected with the at least one upper contact for transmitting the power signal, and the lower contacts of the first sub-circuit board located in the central region comprise at least one lower contact electrically connected with the at least one upper contact for transmitting the test signal, such that an amount of the upper contacts of the second sub-circuit board located in the peripheral region is larger than an amount of the lower contacts of the first sub-circuit board located in the peripheral region.

2. The circuit board for semiconductor test as claimed in claim 1, wherein an amount of the upper contacts of the second sub-circuit board located in the central region is smaller than an amount of the lower contacts of the first sub-circuit board located in the central region.

3. The circuit board for semiconductor test as claimed in claim 1, wherein an amount of the lower contacts of the first sub-circuit board located in the central region is larger than the amount of the lower contacts of the first sub-circuit board located in the peripheral region.

4. The circuit board for semiconductor test as claimed in claim 1, wherein a thickness of the substrate of the first sub-circuit board is larger than a thickness of the substrate of the second sub-circuit board.

5. The circuit board for semiconductor test as claimed in claim 1, wherein the first sub-circuit board comprises a first ground layer, a first power layer, a second ground layer, a second power layer and a third ground layer, which are arranged in a piled manner in order from the upper surface to the lower surface of the first sub-circuit board.

6. The circuit board for semiconductor test as claimed in claim 1, wherein a total amount of the upper contacts of the second sub-circuit board is smaller than a total amount of the lower contacts of the first sub-circuit board.

7. The circuit board for semiconductor test as claimed in claim 1, wherein a dielectric constant of the dielectric material of the substrate of the first sub-circuit board is larger than a dielectric constant of the dielectric material of the substrate of the second sub-circuit board.

8. The circuit board for semiconductor test as claimed in claim 1, wherein the plurality of sub-circuit boards further comprises a third sub-circuit board located above the first sub-circuit board and below the second sub-circuit board; a dielectric constant of the dielectric material of the substrate of the third sub-circuit board is smaller than a dielectric constant of the dielectric material of the substrate of the first sub-circuit board and larger than a dielectric constant of the dielectric material of the substrate of the second sub-circuit board.

9. The circuit board for semiconductor test as claimed in claim 1, wherein the plurality of sub-circuit boards further comprises a third sub-circuit board located above the first sub-circuit board and below the second sub-circuit board; a thickness of the substrate of the third sub-circuit board is smaller than a thickness of the substrate of the first sub-circuit board and larger than a thickness of the substrate of the second sub-circuit board.

10. The circuit board for semiconductor test as claimed in claim 1, wherein an amount of the upper contacts of the second sub-circuit board located in the peripheral region for transmitting the test signal is larger than an amount of the upper contacts of the second sub-circuit board located in the peripheral region for transmitting the power signal; an amount of the lower contacts of the first sub-circuit board located in the peripheral region for transmitting the power signal is larger than an amount of the lower contacts of the first sub-circuit board located in the peripheral region for transmitting the test signal.

11. The circuit board for semiconductor test as claimed in claim 1, wherein an amount of the lower contacts of the first sub-circuit board located in the peripheral region for transmitting the power signal is larger than an amount of the lower contacts of the first sub-circuit board located in the peripheral region for transmitting the test signal; an amount of the upper contacts of the second sub-circuit board located in the central region for transmitting the test signal is larger than an amount of the upper contacts of the second sub-circuit board located in the central region for transmitting the power signal.

12. A circuit board for semiconductor test comprising:
a plurality of sub-circuit boards, each of the sub-circuit boards comprising a substrate formed of dielectric material, and a plurality of circuits formed of conductive material in the substrate for transmitting a test signal and a power signal provided by a tester to a probe head, the substrate having an upper surface and a lower surface, the circuits comprising a plurality of upper contacts located on the upper surface, and a plurality of lower contacts located on the lower surface and electrically connected with the upper contacts; and
at least one insulating dielectric layer disposed between the sub-circuit boards, the insulating dielectric layer comprising a plurality of through holes, and a plurality of connecting conductors disposed in the through holes, each of the connecting conductors being electrically connected with the upper contact of one of the sub-circuit boards and the lower contact of another of the sub-circuit boards;
wherein the circuit board is defined with a central region and a peripheral region; the plurality of sub-circuit boards comprises a first sub-circuit board, and a second sub-circuit board located above the first sub-circuit board; a plurality of the lower contacts of the first sub-circuit board are located in the central region and adapted to be electrically connected with the probe head; a plurality of the upper contacts of the second sub-circuit board are located in the peripheral region and adapted to be electrically connected with the tester; a pitch between two adjacent said upper contacts of the second sub-circuit board located in the peripheral region is larger than a pitch between two adjacent said lower contacts of the first sub-circuit board located in the central region; an amount of the upper contacts of the second sub-circuit board located in the peripheral region is larger than an amount of the lower contacts of the first sub-circuit board located in the peripheral region;
wherein an electronic component is accommodated in one of the through holes of the insulating dielectric layer; the electronic component is electrically connected with the circuit of one of the sub-circuit boards.

13. A circuit board for semiconductor test comprising:
a plurality of sub-circuit boards, each of the sub-circuit boards comprising a substrate formed of dielectric material, and a plurality of circuits formed of conductive material in the substrate for transmitting a test signal and a power signal provided by a tester to a probe head, the substrate having an upper surface and a lower surface, the circuits comprising a plurality of upper contacts located on the upper surface, and a plurality of lower contacts located on the lower surface and electrically connected with the upper contacts; and
at least one insulating dielectric layer disposed between the sub-circuit boards, the insulating dielectric layer comprising a plurality of through holes, and a plurality of connecting conductors disposed in the through holes, each of the connecting conductors being electrically connected with the upper contact of one of the sub-circuit boards and the lower contact of another of the sub-circuit boards;
wherein the circuit board is defined with a central region and a peripheral region; the plurality of sub-circuit boards comprises a first sub-circuit board, and a second sub-circuit board located above the first sub-circuit board; a plurality of the lower contacts of the first sub-circuit board are located in the central region and adapted to be electrically connected with the probe head; a plurality of the upper contacts of the second sub-circuit board are located in the peripheral region and adapted to be electrically connected with the tester; a pitch between two adjacent said upper contacts of the second sub-circuit board located in the peripheral region is larger than a pitch between two adjacent said lower contacts of the first sub-circuit board located in the central region; an amount of the upper contacts of the second sub-circuit board located in the peripheral region is larger than an amount of the lower contacts of the first sub-circuit board located in the peripheral region;

wherein the second sub-circuit board further comprises an electronic component disposed on the upper contact thereof.

\* \* \* \* \*